(12) United States Patent
Nobori et al.

(10) Patent No.: US 6,943,443 B2
(45) Date of Patent: Sep. 13, 2005

(54) ELECTRONIC CIRCUIT DEVICE INCLUDING METALLIC MEMBER HAVING INSTALLATION MEMBERS

(75) Inventors: Kazuhiro Nobori, Katano (JP); Satoshi Ikeda, Suita (JP); Yasushi Kato, Kyoto (JP); Yasufumi Nakajima, Hirakata (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 106 days.

(21) Appl. No.: 10/221,853

(22) PCT Filed: Jan. 15, 2002

(86) PCT No.: PCT/JP02/00167
§ 371 (c)(1),
(2), (4) Date: Sep. 17, 2002

(87) PCT Pub. No.: WO02/058152
PCT Pub. Date: Jul. 25, 2002

(65) Prior Publication Data
US 2003/0106924 A1 Jun. 12, 2003

(30) Foreign Application Priority Data
Jan. 17, 2001 (JP) .......................... 2001-8823

(51) Int. Cl.⁷ ................. H01L 25/07; H01L 23/34; H01L 23/10; H01L 23/04; B23K 31/02
(52) U.S. Cl. ............... 257/704; 257/713; 257/712; 257/710; 257/778; 257/737; 257/738; 257/685; 257/723; 257/777; 257/686; 257/784; 257/668; 257/675
(58) Field of Search .................. 257/704, 707, 257/712, 713, 710, 778, 737, 738, 685, 686, 723, 777, 784, 668, 675

(56) References Cited

U.S. PATENT DOCUMENTS

| 4,034,468 A | * | 7/1977 | Koopman | 29/825 |
|---|---|---|---|---|
| 5,365,403 A | | 11/1994 | Vinciarelli et al. | |
| 5,387,815 A | * | 2/1995 | Nishiguchi | 257/704 |
| 5,396,403 A | * | 3/1995 | Patel | 361/705 |
| 5,909,057 A | * | 6/1999 | McCormick et al. | 257/704 |
| 5,931,222 A | * | 8/1999 | Toy et al. | 165/80.3 |
| 6,008,536 A | * | 12/1999 | Mertol | 257/704 |
| 6,060,772 A | | 5/2000 | Sugawara et al. | |
| 6,246,583 B1 | * | 6/2001 | Cronin et al. | 361/704 |
| 6,472,741 B1 | * | 10/2002 | Chen et al. | 257/712 |
| 6,586,845 B1 | * | 7/2003 | Higashi et al. | 257/784 |
| 6,756,684 B2 | * | 6/2004 | Huang | 257/778 |
| 2003/0080411 A1 | * | 5/2003 | Baek et al. | 257/704 |
| 2003/0183950 A1 | * | 10/2003 | Bolken | 257/786 |
| 2004/0150116 A1 | * | 8/2004 | Wang | 257/777 |

FOREIGN PATENT DOCUMENTS

| EP | 0 547 877 | | 6/1993 | |
| JP | 1-217951 | * | 8/1989 | 257/718 |
| JP | 02-240953 | | 9/1990 | |
| JP | 4-44256 | * | 2/1992 | 257/720 |
| JP | 06-310564 | | 11/1994 | |
| JP | 2000-174186 | * | 6/2000 | |
| JP | 2000-261120 | | 9/2000 | |
| KR | 2001009735 A | * | 2/2001 | |
| KR | 2003045950 A | * | 6/2003 | |

* cited by examiner

Primary Examiner—Alexander Oscar Williams
(74) Attorney, Agent, or Firm—Wenderoth, Lind & Ponack, L.L.P.

(57) ABSTRACT

Bumps are formed on electrodes of semiconductor elements, and moreover, the semiconductor elements with the bumps are electrically connected to metallic members having installation members, whereby wiring lines are eliminated. Stray inductance and conduction resistance resulting from wiring lines can be reduced. A conventional dented connector and a projecting connector are eliminated by connecting the installation members to a second circuit board, thereby enabling an electronic circuit device of a power control system to be made compact.

6 Claims, 8 Drawing Sheets

ELECTRONIC CIRCUIT DEVICE INCLUDING METALLIC MEMBER HAVING INSTALLATION MEMBERS

This application is a National Stage of PCT/JP02/00167 filed Jan. 15, 2002.

TECHNICAL FIELD

The present invention relates to an electronic circuit device of a power control system using semiconductor elements such as IGBTs (Insulated Gate Bipolar Transistors), diodes and the like, for driving motors, and a method for manufacturing the electronic circuit device.

BACKGROUND ART

Lately, a working current in a motor driving device has increased in accordance with an enhancement in performance and function of electronic devices used in the motor driving device, thereby requiring semiconductors to be used to meet a high current. A motor driving device used conventionally is shown in FIG. 16. An example of this conventional motor driving device will be described below with reference to FIG. 16.

In FIG. 16, reference numerals respectively indicate: 1a an IGBT; 1b a diode; 3 a high temperature solder; 4 a metallic element; 5 a sealing resin; 6 a solder; 7 a circuit board; 10 a heat radiation plate; 10a a projecting screw bed; 11 a screw; 12 a surface mounting electronic component (passive element); 13 a surface mounting electronic component (semiconductor element); 14 a metallic base circuit board; 15 a silicone grease; 18 a metallic wire; 19 a metallic lead; 22 a projecting connector; 23 a dented connector; and 24 an insulation resin.

A method for manufacturing this thus-constituted conventional motor driving device will be discussed hereinbelow.

Semiconductor components such as the IGBT 1a, the diode 1b and the like are connected by the high temperature solder 3 to metallic elements 4. The IGBT 1a and the diode 1b, and these semiconductor components and metallic lead 19, are electrically joined together with use of the metallic wire 18. An aluminum wire or a gold wire is normally used as the metallic wire 18. In using a metallic wire 18 formed of, e.g., aluminum, the metallic wire 18 is connected to a second electrode of one of these semiconductor components by performing wedge bonding of the aluminum wire. The second electrode is present opposite to a first electrode of this semiconductor component, which is joined to the metallic element 4. The second electrode of the semiconductor component is formed of aluminum. Oxide films of aluminum on surfaces of both the second electrode and the metallic wire 18 are removed when the second electrode and the metallic wire are pressed into contact with each other with an ultrasonic energy being applied thereto in an ordinary temperature state. The second electrode and the metallic wire 18 are thus joined. The metallic wire 18 joined to the second electrode of the one semiconductor component is routed to the metallic lead 19 obtained by plating copper with tin, and is joined to the metallic lead 19 by performing a wedge bonding method.

Thereafter, for a purpose of physically protecting the one semiconductor component and the metallic wire 18, and improving reliability, the semiconductor component 1 and the metallic wire 18 are coated and sealed with the sealing resin 5 by performing a transfer molding technique or injection molding technique. The metallic lead 19 is bent and cut by molds to be even with the metallic element 4. During this sequence of procedures, an electronic component named "TO-220" comprising the one semiconductor component, the high temperature solder 3, the metallic element 4, the metallic wire 18, the metallic lead 19 and the sealing resin 5 is completed.

After a solder paste is printed onto the metallic base circuit board 14, various components such as the above electronic component "TO-220", the projecting connector 22, and the like are placed on the metallic base circuit board. The metallic base circuit board 14 in its entirety is put into a heating furnace, whereby the solder paste is melted. The solder paste is then set by being returned to an ordinary temperature. This set solder 6 electrically and physically joins the metallic base circuit board 14 to various electronic components such as the electronic component "TO-220", the projecting connector 22, and the like.

For providing electrical insulation, the sealing resin 24 is applied to the metallic base circuit board 14 in its entirety. The metallic base circuit board 14, with the various electronic components, is put into a reduced pressure furnace to remove bubbles mixing inside the sealing resin 24, and then put into a heating furnace to set the sealing resin 24.

Next, the silicone grease 15 is applied to the heat radiation plate 10. The metallic base circuit board 14 is brought into intimate contact with the heat radiation plate 10 and fixed by screws. Then, by inserting the projecting connector 22 into the dented connector 23 after registering the projecting connector 22 mounted on the metallic base circuit board 14 with the dented connector 23 mounted on the circuit board 7, the circuit board 7 is brought into intimate contact with the projecting screw bed 10a and fixed by screws 11.

In the manner as above, the process of mounting to the metallic base circuit board 14 electronic components which include electronic components "TO-220" for switching a motor driving current and requiring heat radiation, and the process of combining the circuit board 7 including the circuit for controlling the electronic components "TO-220" and requiring no heat radiation, are completed.

The above-described arrangement generates a loss caused by a resistance of metallic wires 18 and metallic leads 19 and also a stray inductance because of a length of the wires 18 and leads 19. In addition, for example, since the electronic component "TO-220" is equipped with a metallic lead 19, a larger area than an area of the electronic component "TO-220" is required for the metallic base circuit board 14, thereby impeding miniaturization and high-density mounting.

Meanwhile, a motor driving device for electric products alike has been required to be made compact and highly efficient in terms of heat radiation to meet a recent trend towards lighter, thinner, shorter and smaller construction of electric products. However, when bubbles are present inside the high temperature solder 3, the bubbles obstruct heat transfer generated by a semiconductor component, thereby increasing a resistance from the semiconductor component to the metallic element 4. As a result, only a bubble part becomes high in temperature, which leads to breakage of the semiconductor component 1 in a worst case.

As described hereinabove, the metallic wire 18 is joined to the second electrodes of semiconductor components by performing a wedge bonding method with the aluminum wire. In the conventional art, the metallic wire 18 is limited in thickness due to this joining method, and at the same time the metallic wire 18 is limited in length due to an arrangement of substrate electrodes, thereby making it impossible to reduce a wiring resistance. Coping with an on-state resistance decrease in consequence of recent progress of semiconductor components is thus hindered, with an imposing problem of noise increase resulting from electrical signals' requirement of a high frequency and a large current.

SUMMARY OF THE INVENTION

The present invention is devised to solve the above problems and has for its essential object to provide an electronic circuit device which is compact, has good heat radiation efficiency and can reduce resistance and stray inductance, and provide a method for manufacturing the electronic circuit device.

In order to accomplish this objective, an electronic circuit device is provided according to a first aspect of the present invention, which comprises:

a semiconductor element requiring heat radiation and having electrodes formed on opposite faces thereof;

a first circuit board electrically connected via a metallic plate to a first electrode of the electrodes formed on one of the opposite faces of the semiconductor element, on which circuit board the metallic plate and the semiconductor element are placed;

a second circuit board arranged on a side of the other of the opposite faces of the semiconductor element so as to be opposite to the first circuit board, and having a control circuit for the semiconductor element; and a metallic wire for directly electrically connecting to each other a second electrode, of the electrodes present on the other of the opposite faces, and the second circuit board.

The above metallic wire may be formed to include a first bend portion for absorbing expansion and contraction of the first circuit board and the second circuit board resulting from heat radiation of the semiconductor element.

The metallic wire joined to the second electrode may be extended in a thickness direction of the semiconductor element.

The electronic circuit device may be constituted to further include a heat radiation member with supporting members for receiving the first circuit board thereon and supporting the second circuit board. The metallic wire may be provided with a second bend portion for absorbing, in a state with the second circuit board being supported by the supporting members, expansion and contraction of the first circuit board and the second circuit board resulting from heat radiation, and for pressing the first circuit board against the heat radiation member.

An electronic circuit device of a power control system according to a second aspect of the present invention comprises:

a semiconductor element requiring heat radiation and having first electrodes and second electrodes respectively formed on opposite faces thereof;

bumps formed on the second electrodes; and a metallic member having a first face arranged opposite to the first electrodes so as to be electrically connected to the first electrodes, and including installation members formed of a metal erected on the first face, along a thickness direction of the semiconductor element, to a height which exceeds a height of the bumps in the thickness direction when the semiconductor element with the bumps is placed on the first face.

Three or more installation members may be provided for one metallic member in the above electronic circuit device of the second aspect.

The electronic circuit device of the second aspect may further include a second circuit board which is arranged on a side opposite to that of the first electrodes so as to be electrically connected to the bumps and leading ends of the installation members, and is provided with a control circuit for the semiconductor element.

Also, the above electronic circuit device of the second aspect may further include a heat radiation member with supporting members for receiving the metallic member thereon via an electric insulating member, and dissipating heat conducted from the semiconductor element to the metallic member.

According to a third aspect of the present invention is provided a method for manufacturing an electronic circuit device having:

a semiconductor element requiring heat radiation and having first electrodes and second electrodes respectively formed on opposite faces thereof;

bumps formed on the second electrodes; and a metallic member having a first face arranged opposite to the first electrodes so as to be electrically connected to the first electrodes, and including installation members formed of a metal erected on the first face, along a thickness direction of the semiconductor element, to a height which exceeds a height of the bumps in the thickness direction when the semiconductor element with the bumps is placed on the first face, wherein the method comprises:

bringing the first face of the metallic member and the first electrodes into contact with each other, placing the semiconductor element on the first face, and heating the semiconductor element;

supplying a molten solder to the first face;

relatively pressing the semiconductor element and the metallic member to remove bubbles from inside the molten solder present between the first face and the first electrodes; and decreasing a temperature of the molten solder while maintaining a pressing state, thereby solidifying the molten solder and joining the semiconductor element and the metallic member to each other.

In the manufacturing method of the third aspect, after joining of the semiconductor element and the metallic member, the method further includes a step of electrically connecting the bumps and leading ends of the installation members to a second circuit board which is arranged on a side of the other face and is provided with a control circuit for the semiconductor element, wherein, when a plurality of the metallic members are attached to the second circuit board, heights of the installation members of the metallic members may be adjusted to unify all the metallic members in terms of height with respect to the second circuit board.

As described hereinabove, the electronic circuit device according to the first aspect of the the present invention is provided with the metallic wire for directly electrically connecting the second electrode formed on the other of the opposite faces of the semiconductor element and the second circuit board arranged on the side of the other opposite face. Since the conventional dented connector and projecting connector can be eliminated, the electronic circuit device can be made compact.

Moreover, when the metallic wire is provided with the bend portion, the bend portion can absorb expansion and contraction between the first circuit board and the second circuit board resulting from heat of the semiconductor element.

Since the metallic wire is extended in the thickness direction of the semiconductor element, the electronic circuit device can furthermore be miniaturized.

When the metallic wire is extended in the thickness direction of the semiconductor element and is further provided with the second bend portion, not only miniaturizing the electronic circuit device and absorbing expansion and contraction can both be achieved, but the first circuit board can be pressed against the heat radiation plate, so that heat can be stably removed.

In the electronic circuit device according to the second aspect of the present invention, the semiconductor element! is provided with the bumps on the second electrodes and metallic member having installation members, so that wiring lines are eliminated. Consequently, stray inductance and conduction resistance resulting from wiring lines can be reduced.

In the case where a plurality of the metallic members are provided, the height of the metallic members can be made uniform by being adjusted by the installation members.

Since the semiconductor element and the second circuit board can be directly electically connected to each other by providing the metallic member, the conventional dented connector and projecting connector are eliminated, thus making the electronic circuit device small in size. When the heat radiation member is provided to support the second circuit board, heat from the metallic member can be stably dissipated by the one heat radiation member.

According to the manufacturing method for the electronic circuit device in the third aspect of the present invention, the solder between the semiconductor element and the metallic member is solidified after the semiconductor element and the metallic member are relatively pressed against each other so as to remove bubbles from inside the solder. Therefore, thermal conduction from the semiconductor element to the metallic member will not be obstructed by bubbles, thus being able to prevent an abnormal temperature rise of the semiconductor element.

BRIEF DESCRIPTION OF DRAWINGS

These and other objects and features of the present invention will become clear from the following description taken in conjunction with the preferred embodiments thereof with reference to the accompanying drawings in which.

DETAILED DESCRIPTION OF THE PREFERRED EMBODIMENTS

Figure 1:
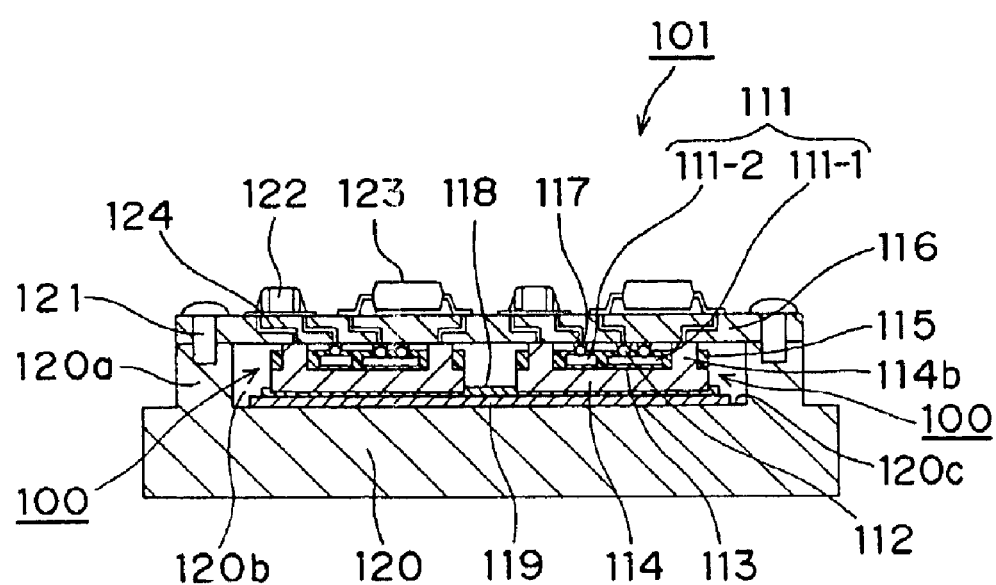
FIG. 1 is a sectional view of a second circuit device as an electronic circuit device of a power control system according to a first embodiment of the present invention.

Before description of the present invention proceeds, it is to be noted that like parts are designated by like reference numerals throughout the accompanying drawings.

Electronic circuit devices according to the preferred embodiments of the present invention and a method for manufacturing the electronic circuit devices will be described below with reference to the drawings.

First Embodiment

Figure 5:
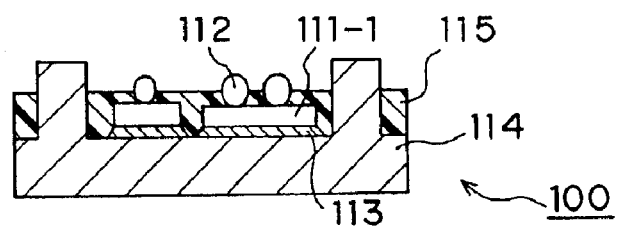
FIG. 5 is a diagram of a state having a sealing resin further provided to the state of FIG. 4.

FIG. 5 shows a first electronic circuit device of a power control system (referred to as "a first circuit unit" hereinbelow) 100 which is one example of an electronic circuit device of this embodiment. FIG. 1 shows a second electronic device of a power control system (referred to as "a second circuit device" below) 101 including first circuit units 100, which corresponds to another example of an electronic circuit device.

Figure 3:
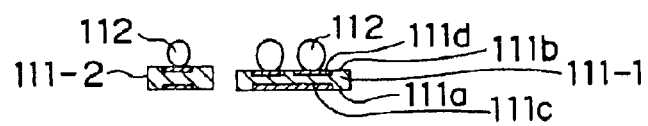
FIG. 3 is a diagram showing a state with bumps formed on the semiconductor elements of FIG. 2.
Figure 4:
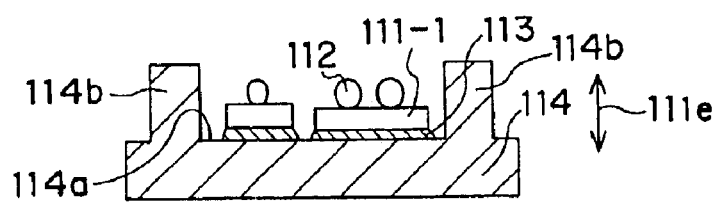
FIG. 4 is a diagram showing a state in which the semiconductor elements with bumps shown in FIG. 3 are mounted to a metallic member.

The second circuit device 101 of FIG. 1 is constituted as follows. 111 is a drive semiconductor element which is used in a control system for controlling a driving current to a driving device, e.g., a motor or the like and which requires a heat radiation treatment. The drive semiconductor element includes an IGBT (Insulated Gate Bipolar Transistor) 111-1 and a diode 111-2. As shown in FIG. 3, the drive semiconductor element 111 has a first electrode 111c and second electrodes 111d formed on opposite faces 111a and 111b, respectively. 112 are bumps (projecting electrodes) formed on the second electrodes 111d of the drive semiconductor element 111. 114 is a metallic member which radiates and diffuses heat generated from the drive semiconductor element 111 as shown in FIG. 4. An entire surface of the metallic member 114 is plated with tin after projecting parts corresponding to installation members 114b, to be described later, are formed from copper as a base material with use of molds. The metallic member 114 has a first face 114a, arranged opposite to the first electrode 111c, to be electrically connected to the first electrode 111c. 113 is a high temperature solder for joining the first electrode 111c of the drive semiconductor element 111 and the first face 114a of the metallic member 114 to each other. The aforementioned installation members 114b are projected from the first face 114a parallel to a thickness direction 111e of the drive semiconductor element 111, and have a height to exceed the bumps 112 in the thickness direction 111e when the drive semiconductor element 111, with the bumps 112 thereon, is placed onto the first face 114a. Although the installation members 114b of a pair are formed in the embodiment, three or more installation members can be formed for one first circuit unit 100. If three or more installation members are formed, a flatness of the first circuit unit 100, when mounted to a second circuit board 116, can be further improved as will be described later.

As indicated in FIG. 5, 115 is a sealing resin for protecting the drive semiconductor element 111 and the bumps 112, which is applied to the drive semiconductor element 111, mounted together with the bumps 112, to the first face 114a to such a level that nearly half a height of the bump 112 is exposed in the thickness direction 111e. The first circuit unit 100 is constituted in the above-described manner.

Figure 6:
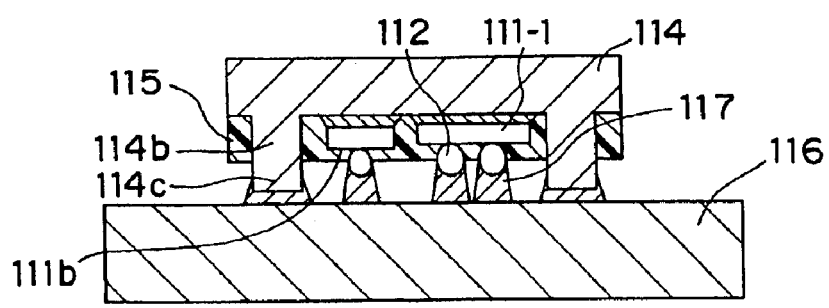
FIG. 6 is a sectional view of a state in which the first circuit unit of FIG. 5 is mounted to a second circuit board.

As is shown in FIG. 6, the first circuit unit 100 is electrically connected, with the bumps 112 and leading ends 114c of the installation members 114b, through a solder 117 applied thereto to the second circuit board 116 arranged at a side of the face 111b of the drive semiconductor element 111.

As shown in FIG. 1, the second circuit board 116 includes a control circuit for the drive semiconductor element 111, with passive electronic components 122, such as a capacitor, a resistor and the like, and active electronic components 123, such as a transistor, a memory, and the like, constituting the control circuit mounted to one face or to both faces of the second circuit board. Internal wirings 124 are provided in the second circuit board 116 to electrically connect the electronic components 122 and 123 to the drive semiconductor element 111.

A heat radiation member 120, on which the metallic member 114 is placed, dissipates heat transferred from the drive semiconductor element 111 to the metallic member 114 into surrounding air. The heat radiation member 120 also has, for instance, a recessed part 120b as shown in FIG. 1 formed by supporting members 120a which support the second circuit board 116. The first circuit unit 100 is stored in the recessed part 120b, and both end parts of the second circuit board 116 are fixed by screws 121 to the pair of the supporting members 120a. An insulating resin 119 of a high heat dissipation efficiency is applied, by performing a heat press method, to a bottom face 120c of the recessed part 120b so as to conduct heat from the metallic member 114 to the heat radiation member 120, and at the same time electrically insulate the metallic member 114 and the heat radiation member 120 from each other. Moreover, a silicone grease 118 is filled between the insulating resin 119 and the metallic member 114 to decrease heat resistance at a contact portion between the metallic member 114 and the insulating resin 119. Since a height of the metallic member 114 is specified as will be discussed later, the silicone grease 118 works as a buffer to press the metallic member 114 towards the insulating resin 119, thereby bringing the metallic member 114 and the insulating resin 119 into intimate contact with each other at all times. A soft sheet may be used in place of the silicon grease 118.

The second circuit device 101 is constituted as above.

A process of forming the above first circuit unit 100 will be described with reference to FIGS. 2–6.

Figure 2:
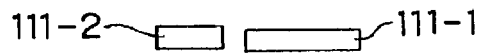
FIG. 2 is a diagram of semiconductor elements constituting a first circuit unit in FIG. 1.

Referring to FIG. 3, gold plating bumps 112 are formed on second aluminum electrodes 111d of the drive semiconductor element 111 of FIG. 2 with use of a projecting electrode forming machine which is an improved wire bonding apparatus, or with use of plating. Then as shown in FIG. 4, in a state in which the drive semiconductor element 111 is placed at a predetermined position on the first face 114a of the metallic member 114, the drive semiconductor element 111 and the metallic member 114 are put into a high temperature furnace heated to 350° C., in which a reducing atmospheric state in a mixed atmosphere of nitrogen and hydrogen is maintained. Molten high temperature solder 113 is supplied, specifically by being dropped according to the embodiment, onto the first face 114a of the metallic member 114 in the high temperature furnace. As a consequence, the first face 114a of the metallic member 114 and the first electrode 111c of the drive semiconductor element 111 are joined by the high temperature solder 113.

After the high temperature solder 113 is supplied, the drive semiconductor element 111 and the metallic member 114 are relatively pressed against each other to remove bubbles from inside the molten solder present between the first face 114a and the first electrode 111c. The metallic member 114 is pressed parallel to the drive semiconductor element 111 so as to bring the metallic member 114 intointimate contact with the drive semiconductor element 111. With an absolute contact state maintained, the metallic member 114 and the drive semiconductor element 111 are cooled to solidify the solder 113. The metallic member 114 and the drive semiconductor element 111 are returned to air after this solidification.

Next in FIG. 5, the sealing resin 115 is formed to mechanically protect the drive semiconductor element 111 itself and joining portions between the drive semiconductor element 111 and the bumps 112. The sealing resin 115 is applied in a liquid state and set by heating, or formed by a transfer molding or an injection molding technique. The first circuit unit 100 is formed during this process.

Subsequently, for protecting the drive semiconductor element 111 and enabling the drive semiconductor element 111 to be handled as an electronic component, the first circuit unit 100 is joined simultaneously to the electronic components 122 and 123 on the second circuit board 116 with use of the solder 117 as shown in FIG. 6. A normally used surface mounting technique (SMT) is employed for this joining.

In the present embodiment as discussed hereinabove, the metallic member 114 is provided with installation members 114b of metal which project from the first face 114a of the metallic member 114 in the thickness direction 111e of the drive semiconductor element 111. Accordingly, an electric connection between the first electrodes 111c of the drive semiconductor element 111 and the second circuit board 116 can be achieved through the installation members 114b, and moreover, the metallic member 114 with the drive semiconductor element 111 can be fixed to the second circuit board 116 through the installation members 114b. Since a conventionally required dented connector 23 and projecting connector 22 are hence eliminated, the first circuit unit 100 and the second circuit device 101 can be made compact in size. At the same time, since the second electrodes 111d of the drive semiconductor element 111 are electrically connected to the second circuit board 116 via the bumps 112, a stray capacity can be reduced in comparison with conventional art which uses metallic wires 18 and metallic leads 19, and a resistance can be decreased.

Since wiring resistance is reduced by this joining via the bumps 112 as compared with the conventional art, reduction of on-state resistance and noise is enabled.

As above, bubbles are removed from inside the solder 113 by relatively pressing the first electrode 111c of the drive semiconductor element 111 and the metallic member 114 against each other to join the same. Thus, the drive semiconductor element 111 is prevented from abnormally overheating because of voids.

Figure 7:
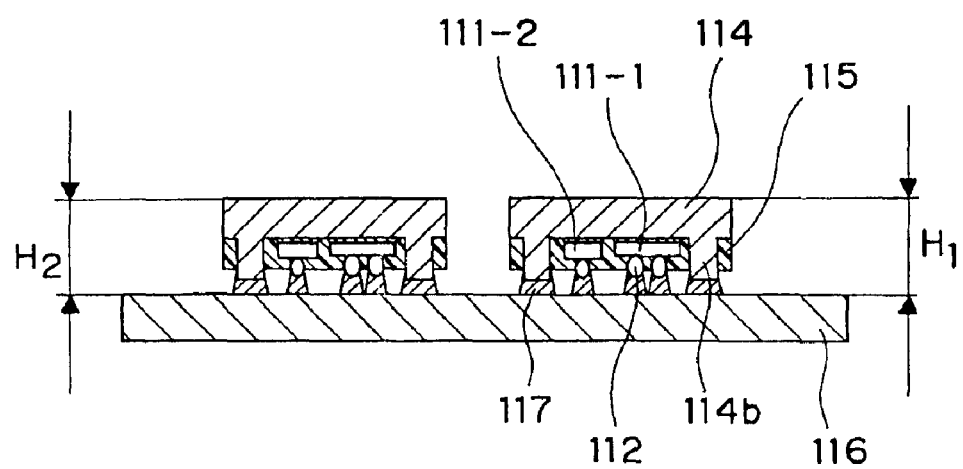
FIG. 7 is a sectional view of a state in which a plurality of the first circuit units are mounted to the second circuit board.

FIG. 7 shows a state in which a plurality of first circuit units 100 are joined to the second circuit board 116 upon completion of procedures in FIGS. 2–5. Although two first circuit units 100 are installed in FIG. 7, needless to say, there may be installed three or more units, or in contrast one unit may be installed. In a case where the plurality of the first circuit units 100 are installed, an error range of heights H1 and H2 of the first circuit units 100, as measured from the second circuit board 116, should be maintained within a specified value. While the metallic member 114 has the installation members 114b, a height of the installation members 114b of each of the metallic members 114 can be adjusted by, e.g., cutting the installation members 114b, whereby a positional accuracy with an error range of within ±50 μm can be realized for the heights H1 and H2.

The second circuit device 101 shown in FIG. 1 is a combination of the second circuit board 116, in a state of FIG. 7, and the heat radiation member 120. The second circuit device 101 naturally exerts the same effects as those of the first circuit unit 100.

Second Embodiment

A fourth circuit device 103 as a modified example of the second circuit device 101 will be described with reference to FIG. 8.

The fourth circuit device 103 includes a third circuit unit 102 which is a modified example of the above first circuit unit 100. Reference numeral 133 of FIG. 8 indicates a first circuit board formed of a metal. Single-sided surface mounting is performed for the second circuit board 116 in FIG. 8.

The third circuit unit 102 has spring wires 136 of a metal and a second metallic member 134 respectively attached in place of the bumps 112 and the metallic member 114 of the first circuit unit 100. Each spring wire 136 is a conductor for electrically connecting the drive semiconductor element 111 and the second circuit board 116 to each other, and has a second bend portion 136a as indicated in FIG. 8. In the fourth circuit device 103 of FIG. 8, one end of each spring wire 136 penetrating the second circuit board 116 is soldered to the second circuit board 116. The second metallic member 134 has no installation member 114b. The second bend portion 136a of each spring wire 136 is not resin sealed by sealing resin 115.

The third circuit unit 102 is constituted the same in other points as the above-described first circuit unit 100.

The third circuit unit 102 of the above constitution has the second metallic member 134 joined to the first circuit board 133 by solder 117. The first circuit board 133 is placed on heat radiation member 120 via silicone grease 118.

In the fourth circuit device 103 constituted as above, the first circuit board 133 can be pressed by the second bend portions 136a of the spring wires 136 to the heat radiation member 120, and moreover, a thermal stress can be absorbed by the spring wires 136, so that a high reliability is realized.

Since each of the spring wires 136 is arranged parallel to thickness direction 111e and is not directed orthogonally to the thickness direction 111e as illustrated, the fourth circuit device 103 is made compact. Furthermore, since bubbles present in solder 113 between drive semiconductor element 111 and the second metallic member 134 are eliminated, the drive semiconductor element 111 can be prevented from abnormally overheating because of voids.

Figure 8:
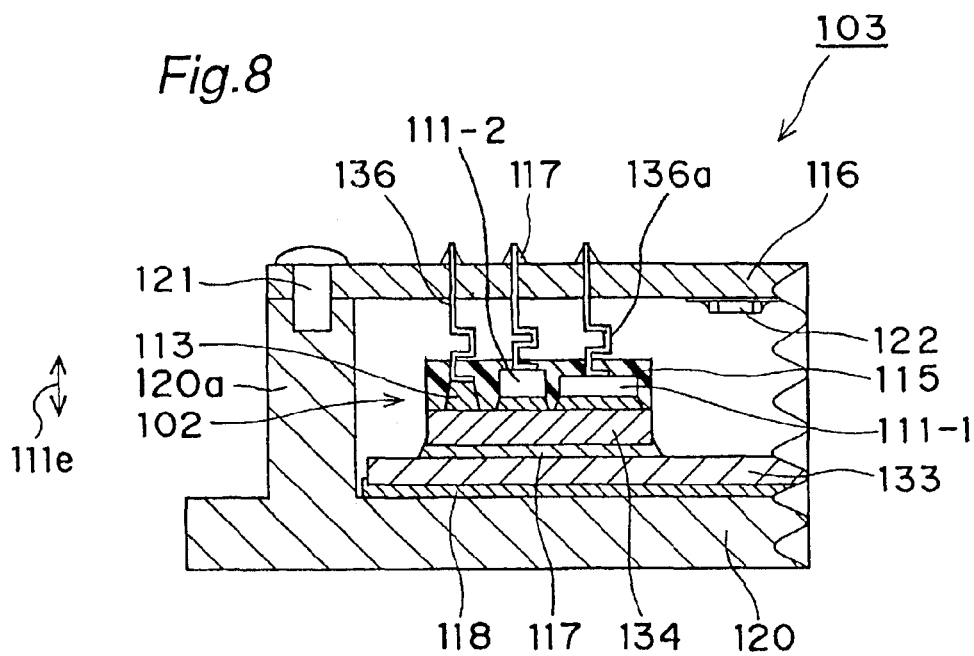
FIG. 8 is a sectional view of a second circuit device as an electronic circuit device of a power control system according to a second embodiment of the present invention.
Figure 9:
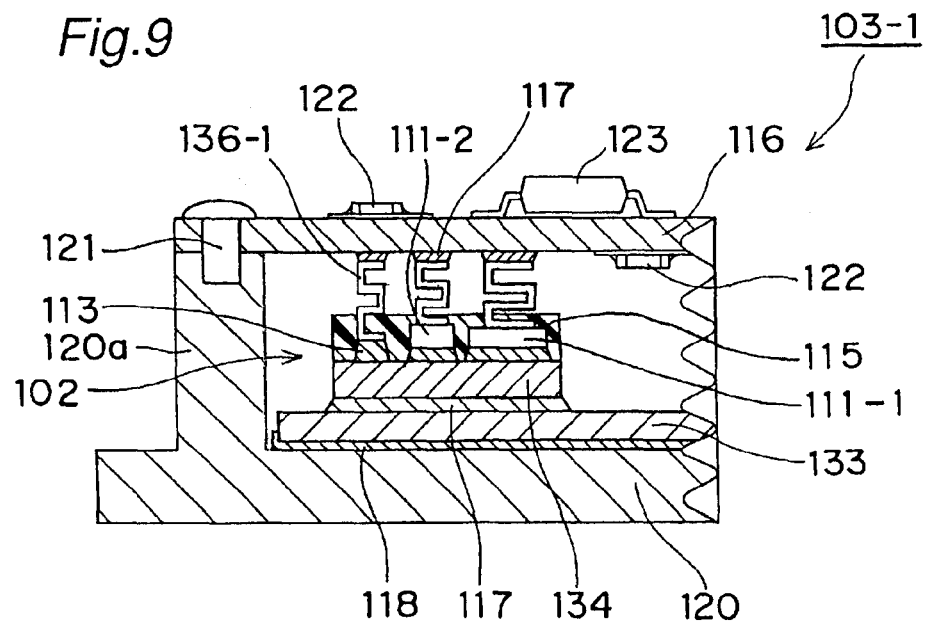
FIG. 9 is a sectional view of a modified example of the second circuit device of FIG. 8.

A fourth circuit device 103-1 shown in FIG. 9 is a modification of the fourth circuit device 103 of FIG. 8, in which spring wires 136-1 are soldered to one face of second circuit board 116 without penetrating the second circuit board 116 as shown in FIG. 9. Double-sided mounting is provided for the second circuit board 116. This modified fourth circuit device 103-1 is of the same constitution in other points as the above-described fourth circuit device 103 indicated in FIG. 8.

The same effects as in the fourth circuit device 103 in FIG. 8 can also be obtained in the fourth circuit device 103-1 of FIG. 9.

Third Embodiment

Figure 10:
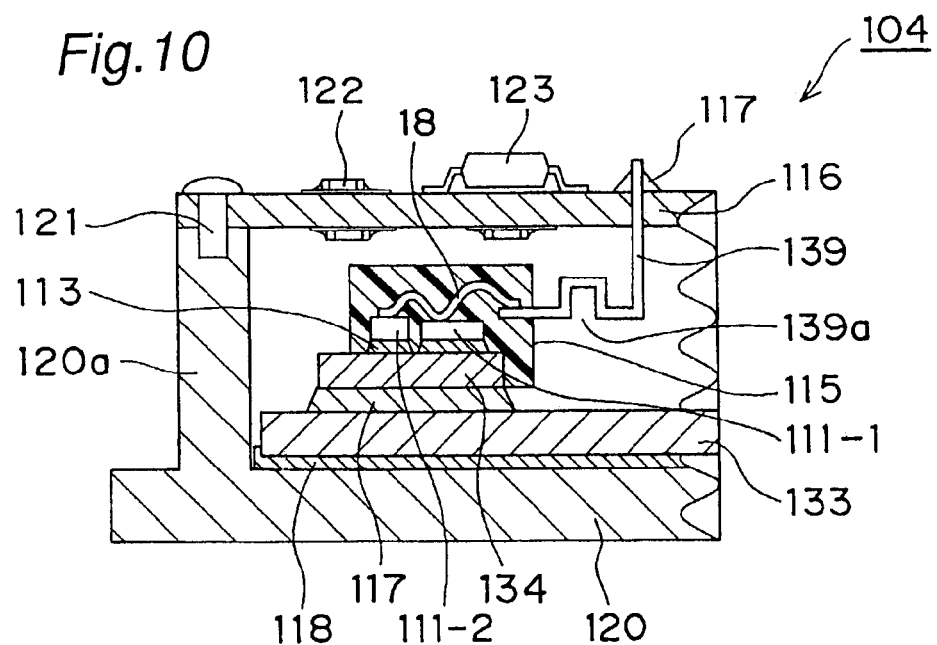
FIG. 10 is a sectional view of a second circuit device as an electronic circuit device of a power control system according to a third embodiment of the present invention.

A fifth circuit device 104 as a modified example of the second circuit device 101 will be depicted with reference to FIG. 10.

Figure 16:
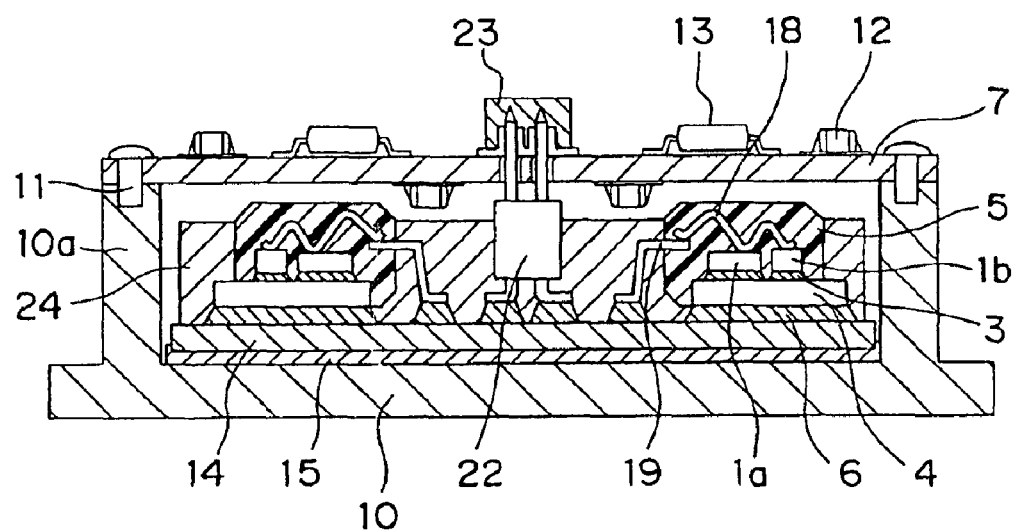
FIG. 16 is a sectional view of a conventional electronic circuit device of a power control system.

The fifth circuit device 104 has a constitution such that the projecting connector 22 and the dented connector 23 are removed from the driving device described with reference to FIG. 16, and a fresh metallic lead 139 is connected to metallic wire 18. Operation of removing bubbles described above is performed during soldering to join drive semiconductor element 111 and second metallic member 134 to one another. Single-sided surface mounting is provided for the second circuit board 116 in FIG. 8.

The metallic lead 139 is a metal wire having tin plating on copper, which is joined to aluminum metallic wire 18 subjected to wedge bonding of aluminum. A first bend portion 139a is formed in a halfway portion of the metallic lead 139. One end of the metallic lead 139 is soldered after passing through the second circuit board 116. Double-sided mounting is performed for the second circuit board 116.

Since the projecting connector 22 and the dented connector 23 are eliminated and the metallic lead 139 is directly connected to the second circuit board 116, the fifth circuit device 104 can be made compact. The first bend portion 139a formed in the metallic lead 139 can absorb thermal stress, thereby realizing a high reliability. Further, since bubbles are removed from inside solder 113 present between the drive semiconductor element 111 and the second metallic member 134, the drive semiconductor element 111 can be prevented from abnormally overheating due to voids.

Figure 11:
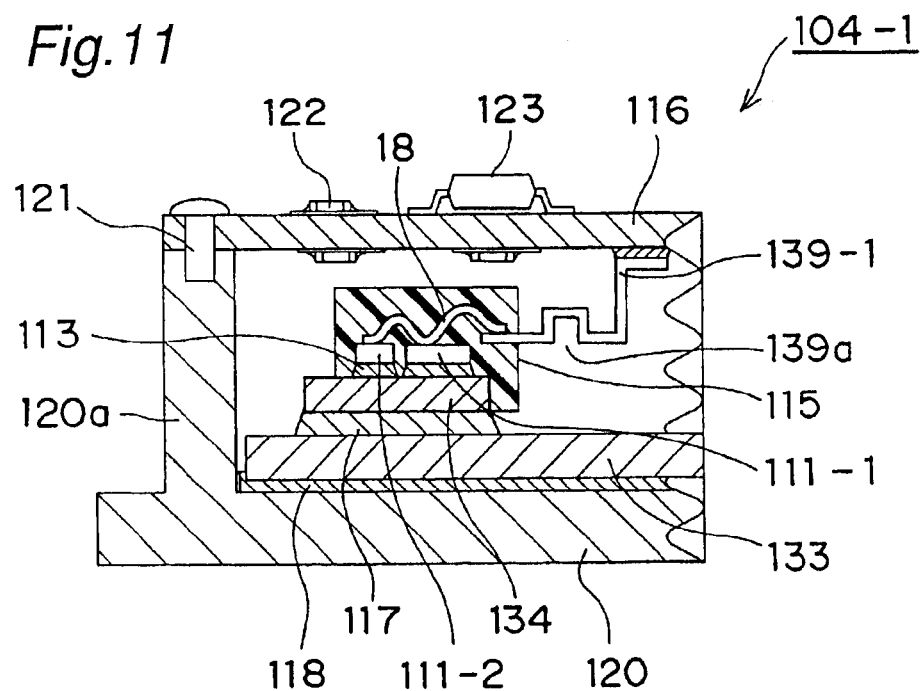
FIG. 11 is a sectional view of a modified example of the second circuit device of FIG. 10.

A fifth circuit device 104-1 in FIG. 11 is a modification of the fifth circuit device 104 of FIG. 10. A metallic lead 139-1 is, as shown in FIG. 11, soldered to one face of second circuit board 116 without penetrating the second circuit board 116. The constitution of the fifth circuit device 104-1 in other points is the same as that of the above-described fifth circuit device 104 shown in FIG. 10.

The fifth circuit device 104-1 can obtain the same effects as in the fifth circuit device 104 shown in FIG. 10.

Fourth Embodiment

A sixth circuit device 105 as a modified example of the above fourth circuit device 103 will be described below with reference to FIG. 12.

The sixth circuit device 105 is provided with metallic wires 141 in place of the spring wires 136 in the fourth circuit device 103. Each metallic wire 141 has a gold ball 140 formed by melting a gold wire by using an electric spark. Each gold ball 140 is joined to drive semiconductor element 111 or the like. Joining of the gold balls 140 is executed by performing a wire bonding technique through heating and ultrasonically vibrating the gold wires. After this joining, each metallic wire 141 is pulled up in a thickness direction 111e, cut to a predetermined length and sealed by the sealing resin 115 to be prevented from deformation. One end of each metallic wire 141 passing through the second circuit board 116 is soldered. The constitution of other points of the sixth circuit device is the same as that of the fourth circuit device 103 described earlier and shown in FIG. 8.

According to the sixth circuit device 105, similar to the fourth circuit device 103, since the metallic wires 141 extend in the thickness direction 111e, the sixth circuit device 105 can be made compact. Moreover, since bubbles are removed from inside solder 113 present between the drive semiconductor element 111 and second metallic member 134, the drive semiconductor element 111 can be prevented from abnormal overheating because of voids.

Figure 12:
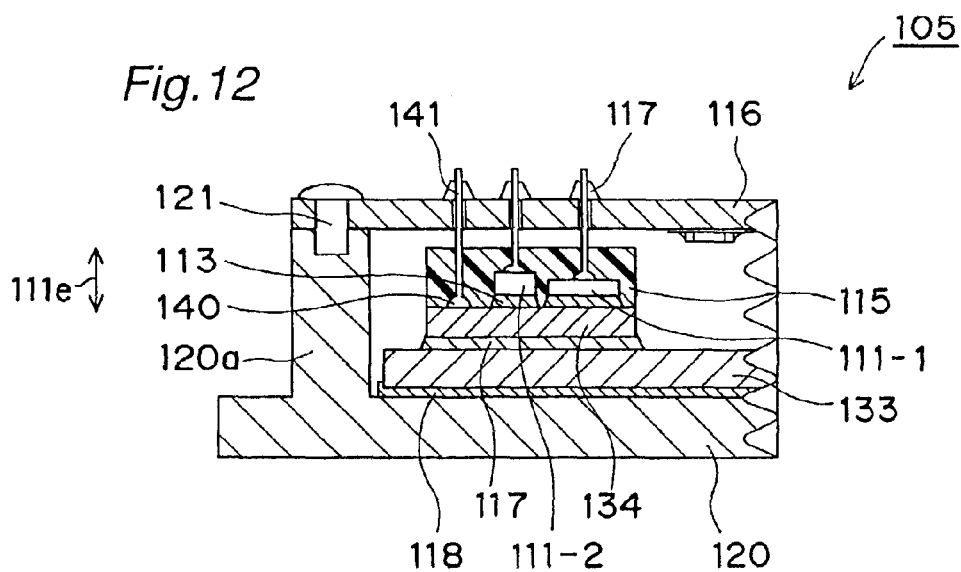
FIG. 12 is a sectional view of a second circuit device as an electronic circuit device of a power control system according to a fourth embodiment of the present invention.
Figure 13:
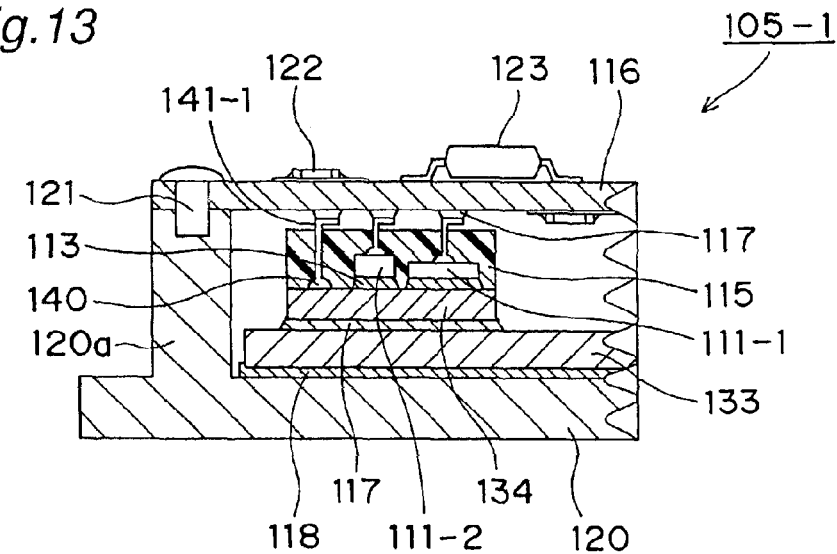
FIG. 13 is a sectional view of a modified example of the second circuit device of FIG. 12.

A sixth circuit device 105-1 in FIG. 13 is a modification of the sixth circuit device 105 in FIG. 12, wherein metallic wires 141-1 are soldered to one face of second circuit board 116 without being passed through the second circuit board 116, as is clear from FIG. 13. The sixth circuit device 105-1 is constituted the same in other points as is the sixth circuit device 105 described above.

The sixth circuit device 105-1 of FIG. 13 can obtain the same effects as the effects of the sixth circuit device of FIG. 12.

Fifth Embodiment

Figure 14:
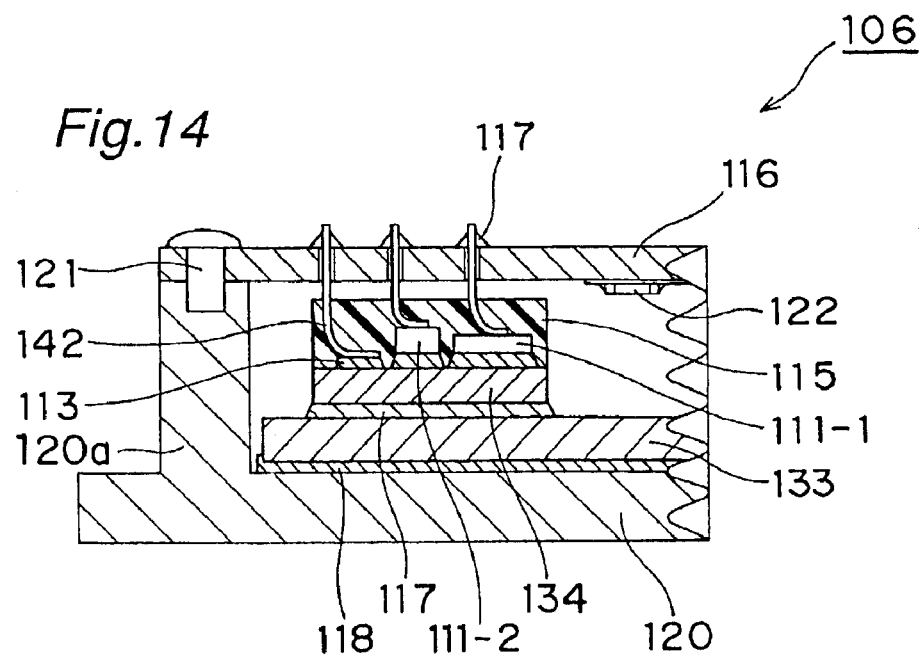
FIG. 14 is a sectional view of a second circuit device as an electronic circuit device of a power control system according to a fifth embodiment of the present invention.

Referring to FIG. 14, a seventh circuit device 106 as a modified example of the fourth circuit device 103 will be depicted herein.

The seventh circuit device 106 uses metallic wires 142 of, e.g., aluminum or copper. The metallic wires 142 are joined to drive semiconductor element 111 or the like by performing a wedge bonding technique with ultrasonic vibration applied. Each metallic wire 142 after being so joined is pulled up in a thickness direction 111e, cut to a predetermined length and sealed by sealing resin 115 to be prevented from deformation. One end of each metallic wire 142, penetrating through second circuit board 116, is soldered. The seventh circuit device 106 is constructed the same in other points as the above-described fourth circuit device 103 shown in FIG. 8.

According to the seventh circuit device 106, similar to the fourth circuit device 103, since the metallic wires 142 extend in the thickness direction 111e, the seventh circuit device 106 can be formed compact in size. Also, since aluminum or copper is used for the metallic wires 142, the seventh circuit, device 106 can be constructed inexpensively as compared with the case of using gold wires. Additionally, a process of removing bubbles prevents the drive semiconductor element 111 from being abnormally overheated.

Figure 15:
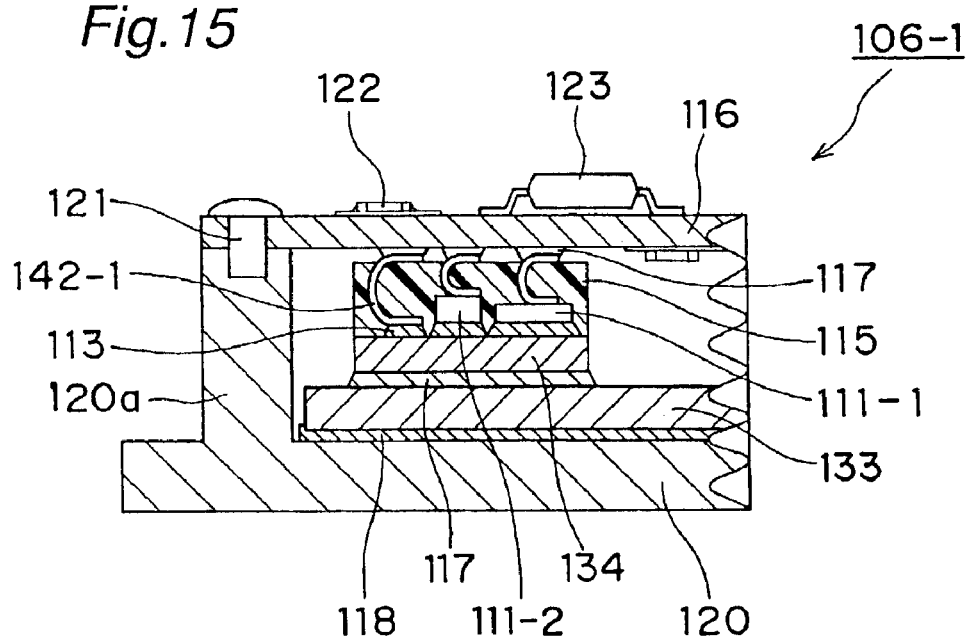
FIG. 15 is a sectional view of a modified example of the second circuit device of FIG. 14.

The seventh circuit device 106 in FIG. 14 is modified by way of example to a seventh circuit device 106-1 shown in FIG. 15. As indicated in FIG. 15, metallic wires 142-1 are soldered to one face of second circuit board 116 without penetrating the second circuit board. The modified seventh circuit device 106-1 is of the same constitution in other points as the aforementioned seventh circuit device 106.

The seventh circuit device 106-1 of FIG. 14 can obtain the same effects as the seventh circuit device 106 shown in FIG. 13.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An electronic circuit device comprising:
   a semiconductor element having a first surface and a second surface, with said first and second surfaces facing in opposite directions;
   a first electrode on said first surface;
   a second electrode on said second surface;
   a bump on said second electrode;
   a metallic member having metal installation members extending from a first face of said metallic member; and
   a circuit board electrically connected to said bump and to leading end parts of said metal installation members, said circuit board having a control circuit for said semiconductor element,
   wherein said first face of said metallic member is electrically connected to said first electrode such that said metal installation members extend from said first face to a level beyond a level at which said bump is positioned.

2. The electronic circuit device according to claim 1, wherein said semiconductor element requires heat radiation therefrom, and further comprising:
   a heat radiation member connected to said metallic member via an electric insulating member, said heat radiation member for dissipating heat from said semiconductor element to said metallic member.

3. The electronic circuit device according to claim 2, wherein said heat radiation member includes supporting members.

4. The electronic circuit device according to claim 3, wherein said circuit board is connected to said supporting members.

5. The electronic circuit device according to claim 4, wherein said metallic member is between supporting members.

6. The electronic circuit device according to claim 3, wherein said metallic member is between said supporting members.

* * * * *

UNITED STATES PATENT AND TRADEMARK OFFICE
CERTIFICATE OF CORRECTION

PATENT NO. : 6,943,443 B2
DATED : September 13, 2005
INVENTOR(S) : Kazuhiro Nobori et al.

It is certified that error appears in the above-identified patent and that said Letters Patent is hereby corrected as shown below:

Column 12,
Line 43, replace "between supporting members." with -- between said supporting members. --.

Signed and Sealed this

Twenty-eighth Day of March, 2006

JON W. DUDAS
*Director of the United States Patent and Trademark Office*